(12) United States Patent
Hsu et al.

(10) Patent No.: US 6,670,234 B2
(45) Date of Patent: Dec. 30, 2003

(54) METHOD OF INTEGRATING VOLATILE AND NON-VOLATILE MEMORY CELLS ON THE SAME SUBSTRATE AND A SEMICONDUCTOR MEMORY DEVICE THEREOF

(75) Inventors: Louis L. Hsu, Fishkill, NY (US); Carl J. Radens, LaGrangeville, NY (US); Li-Kong Wang, Montvale, NJ (US)

(73) Assignee: International Business Machines Corporation, Armonk, NY (US)

( * ) Notice: Subject to any disclaimer, the term of this patent is extended or adjusted under 35 U.S.C. 154(b) by 72 days.

(21) Appl. No.: 09/887,403

(22) Filed: Jun. 22, 2001

(65) Prior Publication Data

US 2002/0197792 A1 Dec. 26, 2002

(51) Int. Cl.$^7$ .............................................. H01L 21/00
(52) U.S. Cl. ................................................. 438/246
(58) Field of Search ................................ 438/214, 227, 438/246

(56) References Cited

U.S. PATENT DOCUMENTS

| | | | | |
|---|---|---|---|---|
| 5,480,828 A | * | 1/1996 | Hsu et al. ..................... | 438/275 |
| 5,799,200 A | | 8/1998 | Brant et al. .................. | 713/340 |
| 5,841,694 A | | 11/1998 | Wong ..................... | 365/185.05 |
| 5,867,425 A | | 2/1999 | Wong ..................... | 365/185.08 |
| 5,963,476 A | | 10/1999 | Hung et al. ............. | 365/185.22 |
| 5,966,727 A | | 10/1999 | Nishino ..................... | 711/127 |
| 5,998,826 A | | 12/1999 | Hung et al. .................. | 257/315 |
| 6,026,028 A | | 2/2000 | Lin et al. ............... | 365/185.33 |
| 6,043,123 A | | 3/2000 | Wang et al. ................. | 438/258 |
| 6,052,305 A | | 4/2000 | Yang et al. ............. | 365/185.18 |
| 6,055,655 A | * | 4/2000 | Momohara .................. | 714/723 |
| 6,141,242 A | | 10/2000 | Hsu et al. ..................... | 365/185 |
| 6,312,982 B1 | * | 11/2001 | Takato et al. ................ | 438/238 |

OTHER PUBLICATIONS

U.S. patent application Ser. No.: 09/668,977, filing date Sep. 25, 2000, Inventors Houghton et al.

C.J. Radens et al., "A 0.135 $\mu m^2$ $6F^2$ Trench–Sidewall Vertical Device Cell for 4Gb/16Gb DRAM," 2000 IEEE pp. 80–81.

L. Nesbit, et al., "A 0.6 $\mu m^2$ 256Mb Trench DRAM Cell With Self–Aligned BuriEd Strap (BEST)," 1993 IEEE pp. 627–630.

U. Gruening, et al. "A Novel Trench DRAM Cell with a VERtIcal Access Transistor and BuriEd Strap (VERI BEST) for 4Gb/16Gb," 1999 IEEE pp. 25–28.

T. Rupp et al., "Extending Trench DRAM Technology to 0.15 $\mu m$ Groundrule and Beyond," 1999 IEEE pp. 33–36.

G. Bronner, et al., "A Fully Planarized 0.25 $\mu m$ CMOS Technology for 256Mbit DRAM and Beyond," 1995 pp. 15–16.

\* cited by examiner

*Primary Examiner*—William David Coleman
(74) *Attorney, Agent, or Firm*—Louis J. Percello; F. Chau & Associates, LLP

(57) ABSTRACT

A method for fabricating DRAM and flash memory cells on a single chip includes providing a silicon substrate, forming a trench capacitor for each of the DRAM cells in the silicon substrate, forming isolation regions in the silicon substrate which are electrically isolated from each other, forming first type wells for DRAM and flash memory cells at first predetermined regions of the silicon substrate by implanting a first type impurity in the first predetermined regions, forming second type wells for DRAM and flash memory cells at second predetermined regions in the first type wells by implanting a second type impurity in the second predetermined regions, forming oxide layers for DRAM and flash memory cells on the second type wells, forming gate electrodes for DRAM and flash memory cells on the oxide layers for DRAM and flash memory cells, and forming source and drain regions for DRAM and flash memory cells in the respective second type wells for DRAM and flash memory cells, in which the source and drain regions are associated with each of the gate electrodes for DRAM and flash memory cells.

19 Claims, 16 Drawing Sheets

METHOD OF INTEGRATING VOLATILE AND NON-VOLATILE MEMORY CELLS ON THE SAME SUBSTRATE AND A SEMICONDUCTOR MEMORY DEVICE THEREOF

BACKGROUND OF THE INVENTION

1. Field of the Invention

The present invention relates to a method of fabricating semiconductor memory devices, and more particularly, to a method for integrating volatile and non-volatile memory devices on a single chip.

2. Description of the Related Art

Generally, electronic systems in various applications require, in addition to data processing units, memory devices to store data therein and/or read data therefrom. For enhanced performance, an electronic system may need dynamic random access memory (DRAM) devices and flash memory devices functionally or physically together. In this case, it is common that a DRAM device is used as temporary storage, and a flash memory device is used to store firmware and nonvolatile data. Such a combination of DRAM and flash memory devices can boost the system performance.

Especially, in portable electronic products, such as laptops and palm computers, where battery lifetime is a limitation on the performance and functionality of electronic systems of the products, such a combination of DRAM and flash memory devices is desirable to enhance the system performance. In such electronic systems, power consumption is an important factor determining the battery lifetime.

In general, volatile memory devices, such as DRAM devices, have higher data access speed and lower power consumption than those of non-volatile memory devices, such as flash memory devices, when sizes of the volatile and non-volatile memory devices are substantially equal. For example, a typical 100MHz SDRAM has a burst data rate of about 200 MB/sec, while the read performance of a linear flash memory is only about 20 MB/sec. Also, the data read power consumption in the flash memory is about 1.6 times as large as that of the DRAM. Thus, the power consumption as well as the system performance of an electronic system can be enhanced by employing DRAM devices.

DRAM devices can be used as a "shadow" of flash memory devices. For example, some portion of the application codes and/or operating system codes can be copied into a DRAM device after the system is powered on. This would allow data drivers such as graphic data driver or soft-modem to run at a faster speed. Also, during updating the application codes that are stored in a flash memory, the system can continue its normal operation through accessing the DRAM device. In other words, updating the data in a flash memory can be performed concurrently or sequentially without compromising the system performance.

DRAM devices are also used to store volatile data such as system stack, scratch-pad variables, frame buffers, etc. Thus, more utilization can be implemented with DRAM devices, while data can be stored for a longer time period in flash memory devices. DRAM devices also provide high density data storage and wide bandwidth for data read and write.

Drawbacks in the DRAM devices include incapability of saving data during power is down. Refresh has to be performed frequently to preserve valid data. This refresh process not only consumes power but also interrupts the availability of the data when the system requests.

On the other hand, flash memory has the advantage of nonvolatility so that the memory can preserve stored data when the system is not in active use. For example, when the power is interrupted due to changing battery in a portable system, data stored in flash memory can be preserved.

In conventional semiconductor memory devices, however, DRAM and flash memory devices are equipped in an electronic system using multi-chip packages. Semiconductor memory devices having the DRAM and flash memory devices using the multi-chip packages have drawbacks such as high manufacturing cost, degradation of the system performance, decrease in the integration density, and so on. Semiconductor memory devices fabricated using the conventional multi-chip approach are degraded in their performance due to narrow bandwidth. This is because stand-alone chips in a multi-chip package have limitation in data input/output. Thus, such a limitation restricts the number of data bandwidth.

Therefore, a need exists for a semiconductor memory device having the advantages of the high data bandwidth and access speed of DRAM devices and nonvolatility and power saving of flash memory devices. It would be advantageous to provide a semiconductor memory device having volatile and non-volatile memory devices merged into a single chip. It is also desirable to provide a method of integrating volatile and non-volatile memory devices on a single chip using minimized process steps.

OBJECTS AND SUMMARY OF THE INVENTION

It is an object of the present invention to provide a semiconductor memory device having merged volatile and non-volatile memory devices on a single chip.

It is another object of the present invention to provide a method of merging volatile and non-volatile memory devices in a single chip through a simplified process.

It is still another object of the present invention to provide a method of fabricating volatile and non-volatile memory devices and support devices on a single chip using a process having minimized steps.

It is further object of the present invention to provide a semiconductor memory device with high integration density by integrating DRAM and flash memory devices and support devices in a single chip.

To achieve the above and other objects, the present invention provides a method for fabricating dynamic random access memory (DRAM) and flash memory cells on a single chip. A method of the present invention includes providing a silicon substrate; forming a trench capacitor for each of the DRAM cells in the silicon substrate; forming isolation regions in the silicon substrate, the isolation regions being electrically isolated from each other; forming first type wells for DRAM and flash memory cells at first predetermined regions of the silicon substrate by implanting a first type impurity in the first predetermined regions; forming second type wells for DRAM and flash memory cells at second predetermined regions in the first type wells by implanting a second type impurity in the second predetermined regions; forming oxide layers for DRAM and flash memory cells on the second type wells; forming gate electrodes for DRAM and flash memory cells on the oxide layers for DRAM and flash memory cells; and forming source and drain regions for DRAM and flash memory cells in the respective second type wells for DRAM and flash memory cells, in which the source and drain regions are associated with each of the gate electrodes for DRAM and flash memory cells. The method may further include forming first type wells for support devices in the silicon substrate by implanting the first type impurity; forming second type wells for support devices in the silicon substrate by implanting the second type impurity; and forming oxide layers for support devices on the first and second type wells for support devices. The method may also include forming gate electrodes for support devices on the oxide layers for support devices; and forming source and drain regions for support devices in the first and second type wells for support devices, in which the source and drain regions for support devices are associated with each of the gate electrodes for support devices.

In another aspect of the present invention, there is provided a method for fabricating DRAM and flash memory cells on a single chip, which includes providing a silicon substrate; forming isolation regions in the silicon substrate, the isolation regions being electrically isolated from each other; forming first type wells for DRAM and flash memory cells at first predetermined regions of the silicon substrate by implanting a first type impurity in the first predetermined regions; forming second type wells for DRAM and flash memory cells at second predetermined regions in the first type wells by implanting a second type impurity in the second predetermined regions; forming oxide layers for DRAM and flash memory cells on the second type wells; forming gate electrodes for DRAM and flash memory cells on the oxide layers for DRAM and flash memory cells; forming source and drain regions for DRAM and flash memory cells in the respective second type wells for DRAM and flash memory cells, the source and drain regions being associated with each of the gate electrodes for DRAM and flash memory cells; forming a contact on each of second type wells for DRAM cells; forming a stacked capacitor connected to the contact; and forming a plate electrode on the stacked capacitor, wherein the stacked capacitor and the plate electrode serve as a capacitance storage for a corresponding DRAM cell. The method preferably further includes forming n-wells and p-wells for support devices in the silicon substrate; forming oxide layers for support devices on the n-wells and p-wells for support devices; and forming gate electrodes for support devices on the oxide layer for support devices.

According to another aspect of the present invention, there is provided a semiconductor memory device including a silicon substrate, DRAM cells each formed at respective first predetermined regions of the silicon substrate, flash memory cells each formed at respective second predetermined regions of the silicon substrate, isolation regions formed in the silicon substrate to electrically isolate the DRAM and flash memory cells from each other, and a trench capacitor formed for each of the DRAM cells in the silicon substrate. The semiconductor memory device may further include an $n^+$-type buried capacitor plate formed in the silicon substrate and connected to the trench capacitor, and an n-type band layer formed in the silicon substrate and connected to the $n^+$-type buried capacitor plate and corresponding one of the DRAM cells.

According to the present invention, DRAM devices merged with flash memory devices in a single chip do not require data refresh during sleep mode because data required by the system is stored in the flash memory and retrieved when the system returns to an active (or normal) mode.

A semiconductor memory device having structure of merged DRAM and flash memory devices also improves communication between memory and a central processing unit as well as communication between the DRAM and flash memory devices. Also, the existing DRAM built-in-self-test (BIST) technique allows DRAM to be tested at a high-speed without accessing all the internal nodes. Thus, the merged structure of DRAM and flash memory devices would be a low-cost solution of the problems in the conventional memory devices.

In the method of integrating the semiconductor memory device of the present invention, the process of integrating flash memory and DRAM devices may share as many process steps as possible so that the process is simplified and the manufacturing cost is reduced.

DESCRIPTION OF PREFERRED ENBODIMENTS

Detailed illustrative embodiments of the present invention are disclosed herein. However, specific structural and functional details disclosed herein are merely representative for purposes of describing preferred embodiments of the present invention.

The present invention provides a method of fabricating a semiconductor memory device having volatile memory such as dynamic random access memory (DRAM) and non-volatile memory such as flash memory which are merged into a single chip using a system on-chip (SOC) design. Preferably, volatile and non-volatile memory devices are simultaneously built on a single chip by embedding volatile memory devices into non-volatile memory devices and vice versa. The fabrication process also includes integration on a single chip of support circuits for the memory devices. In the fabrication of the memory devices and support devices on a single chip, the present invention advantageously employs a simplified process in which steps for forming each device are shared and performed simultaneously.

The present invention also provides a voltage generate system for merged DRAM and flash memory devices, which is integrated with the memory device on a single chip.

Figure 1:
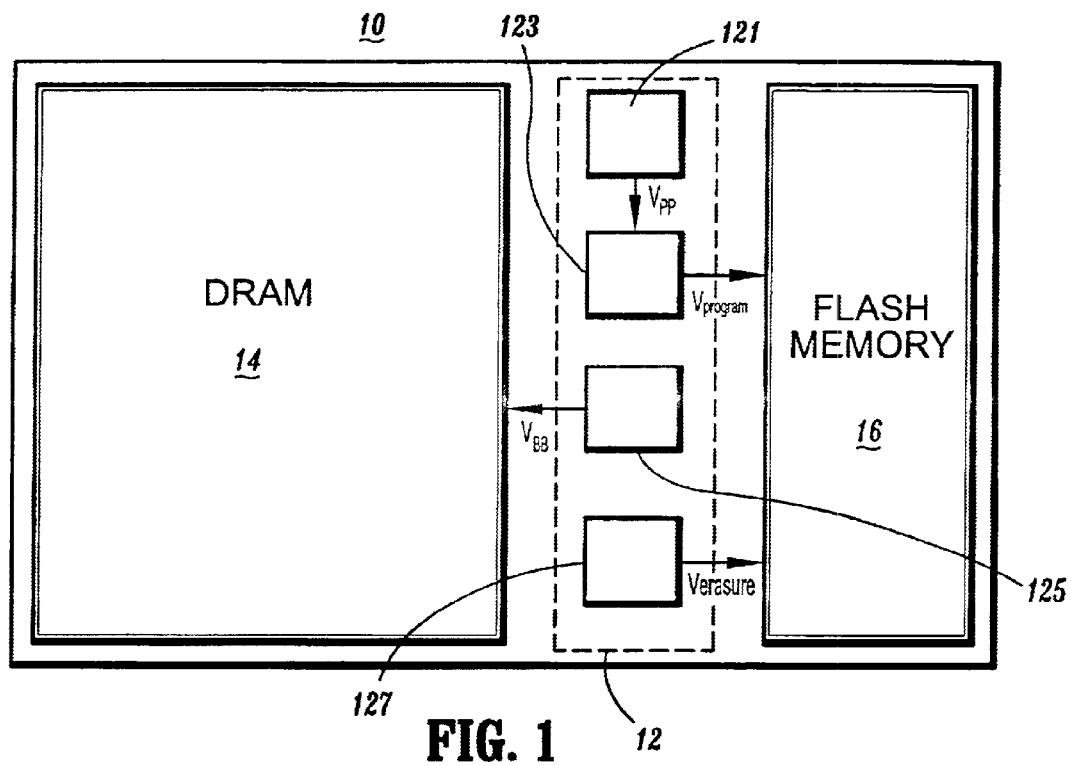
FIG. 1 is a block diagram illustrating a semiconductor memory device having a unified voltage generate system according to a preferred embodiment of the present invention.

Referring to FIG. 1, there is provided a block diagram illustrating a semiconductor memory device according to a preferred embodiment of the present invention. The semiconductor memory device 10 includes a voltage generator 12, a DRAM array 14, and a flash memory array 16. The voltage generator 12 is integrated in a single chip and shared by the DRAM and flash memory arrays 14, 16 to form a unified voltage generate system.

The voltage generator 12 preferably includes a boosted voltage generator 121, a program voltage generator 123, a substrate bias voltage generator 125, and an erasure voltage generator 127. The boosted voltage generator 121 provides a boosted voltage which is used, for example, for a wordline boost voltage (Vpp). The boosted voltage is also used as an intermediate voltage for the program voltage generator 123 which provides a programming voltage (Vprogram) to the flash memory array 16. For example, the boosted voltage is about 2.2 volts when the boosted voltage generator 121 receives a supply voltage of about 1.2 volts. A charge pump circuit (not shown) with high efficiency in the boosted voltage generator 121 is able to increase the input voltage level (i.e., the supply voltage). The charge pump circuit is well known in the art, thus a detailed description thereof is omitted.

The program voltage generator 123 generates the programming voltage (Vprogram) for the flash memory array 16 using the boosted voltage (Vpp) from the boosted voltage generator 121 instead of using the supply voltage so that efficiency of the power supply system can be improved. Since wordline activation and flash memory programming seldom occur simultaneously, the charge pump circuit can be shared by the boosted voltage generator 121 and the programming voltage generator 123. Thus, the size of the semiconductor memory device 10 is reduced and the power consumption in the semiconductor memory device 10 is also reduced.

The substrate bias voltage generator 125 generates a substrate bias voltage ($V_{BB}$, e.g., –0.5 V) for the DRAM array 14. The substrate bias voltage ($V_{BB}$) is provided to generate an erasure voltage (Verasure) for the flash memory array 16 via the erasure voltage generator 127. Integration and structure of a unified voltage generate system is more completely described in a commonly assigned patent application entitled, Integrated Power Solution For System On Chip Applications (application Ser. No. 09/668,977), filed on Sep. 25, 2000, the disclosure in its entirety is incorporated by reference herein.

By combining DRAM and flash memory devices on a single chip, refresh is no longer necessary for the DRAM array 14. In the semiconductor memory device 10, all the mission-critical data is loaded into the flash memory array 16 prior to the system enters into a sleep mode. The mission-critical data includes data required by the system at the time of returning to an active mode, for example, address information for web sites or wireless communication stations accessed recently. Since the data stored in the flash memory array 16 is nonvolatile, no refresh operation is needed.

Figure 2A:
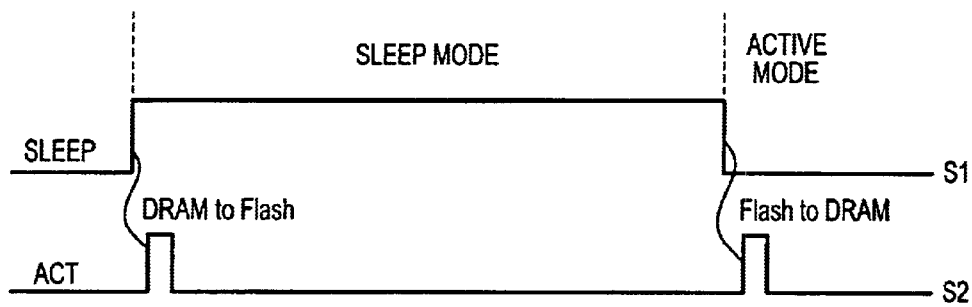
FIGS. 2A and 2B show signals and a flow diagram, respectively, for describing the data preserve operation during a sleep mode.
Figure 2B:
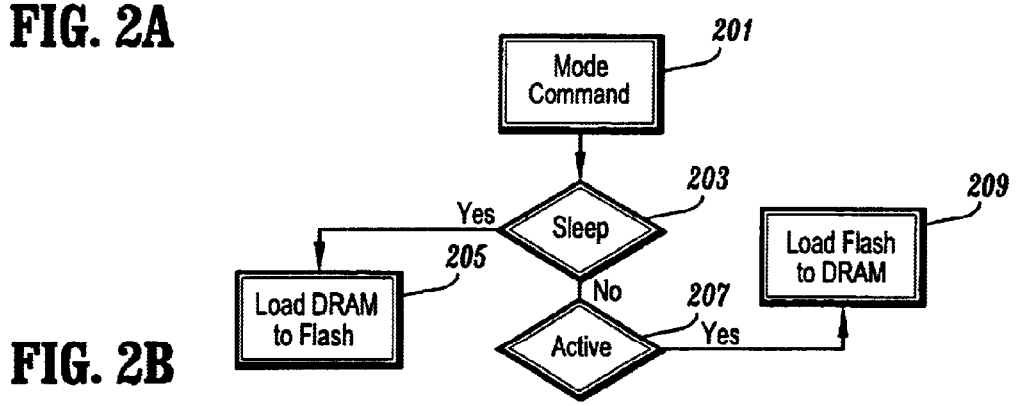

FIGS. 2A and 2B illustrates the transfer of data from a DRAM array to a flash memory at the time of entering into a sleep mode. In FIG. 2A, a sleep mode control signal S1 is activated (e.g., "high") when the system is entered into a sleep mode, and a mode change signal S2 has a pulse when the system changes the mode from the sleep mode to the active mode and vice versa. For example, when the sleep mode control signal S1 is activated, a pulse of the mode change signal S2 is provided to the DRAM and flash memory arrays so that the mission-critical data in the DRAM array is transferred to the flash memory array. When the system recovers to the active mode, the sleep mode control signal S1 becomes inactive (e.g., "low") and another pulse of the mode change signal S2 is provided to the DRAM and flash memory arrays. As a result, the mission-critical data stored in the flash memory array is loaded into the DRAM array to resume normal operation.

FIG. 2B is a flow chart for describing the data preserve operation during a sleep mode. From a processor in the system, a mode command is provided to the memory to determine when the system enters into a sleep mode, returns to an active mode, etc. (step 201). It is determined in step 203 whether the system is in a sleep mode. If the system is in a sleep mode, the mission-critical data is loaded into the flash memory array from the DRAM array (step 205).

If the system is not in the sleep mode, it is determined in step 207 whether the system is in the active mode. If the system is in the active mode, the mission-critical data stored in the flash memory array is loaded into the DRAM array (step 209).

In the semiconductor memory device according to the present invention, since the DRAM array does not require any refresh operation, the support circuits for the data refresh, such as refresh counters and refresh address generators, are not required. Thus, the cell efficiency of the DRAM array, i.e., the area ratio of the DRAM array to whole DRAM macro, is significantly increased. Also, power that would otherwise be consumed for the refresh can be saved so that the battery life can be extended.

Generally, it is necessary in electronic systems, such as cellular phones or PDA, to update or upgrade internal codes for the system configuration or other purposes. To perform such an updating operation, the system should stop all other operations and erase old data (or old codes) in the flash memory using a high voltage (e.g., –9 volts). Then, the system programs new data (i.e., a set of new codes) into the flash memory.

In the semiconductor memory device of the present invention, data in the flash memory array can be modified or updated by first storing new data in the DRAM array. In other words, the DRAM array is used as a scratch pad to temporarily store the new data therein. By updating the data in the flash memory with the new data temporarily stored in the DRAM array, the overall system performance is not degraded. Thus, there is no longer a need for the system to wait for a time period which would otherwise be necessary to update the flash memory.

The merged DRAM and flash memory macros may also be embedded into a central process unit (CPU) chip. A method of integrating the memory devices and support circuits and/or CPU circuits will be described in detail.

In the structure of merged memory devices and a CPU in a single chip, a DRAM array is preferably used as a cache memory for the CPU, while a flash memory array is used for storing hard-coded programs, operating systems, etc. Also, communication between the DRAM array and the CPU is improved if a wide bandwidth is used.

A method of integrating volatile and non-volatile memory devices with support circuits on a single chip will be described with reference to FIGS. 3–17.

Figure 3:
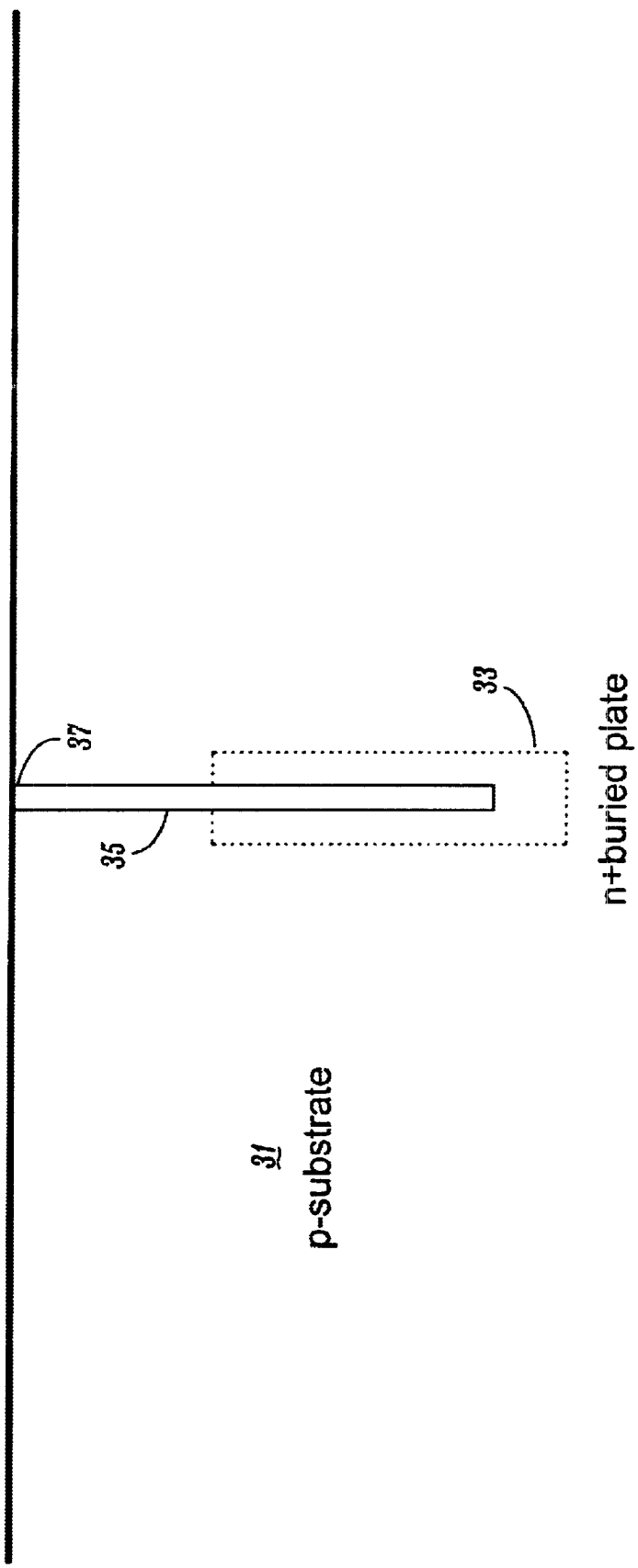
FIG. 3 is a cross-sectional view illustrating formation of a trench capacitor, $n^+$-buried plate, and buried strap in a substrate according to the present invention.

Referring to FIG. 3, there is provided a cross-sectional view illustrating formation of a trench capacitor, buried strap, and a buried plate in a silicon substrate. The silicon substrate 31 may be a silicon-on-insulator (SOI) and preferably a p-substrate, and the buried capacitor plate 33 is, for example, an n-buried capacitor plate. The trench capacitor 35 is formed in the substrate 31 by using, for example, photolithography and reactive ion etching (RIE) techniques. The depth of the trench capacitor 35 is preferably about 6–10 $\mu$m.

The n$^+$-buried plate 33 is formed by outdiffusing arsenic (As) from the lower portion of the trench. As-doped glass (ASG) may be used to form the n$^+$-buried plate 33. In the formation of the n$^+$-buried plate 33, an isolation collar (not shown) is formed using the processes of dry plasma etching, low pressure chemical vapor deposition (LPCVD) and RIE, and a thin node capacitor dielectric is formed using LPCVD of silicon nitride to a final thickness of about 2.5 nm - 10 nm. The trench is then filled with polysilicon by LPCVD.

The buried strap contact 37 is formed at the surface of the p-substrate by performing the dry etch recess and silicon deposition using the LPCVD. Preferably, the isolation collar is formed in the upper region of the trench to suppress the formation of parasitic leakage paths out of the trench capacitor 35. A detailed description of the formation of a deep trench capacitor, a buried strap contact, an isolation collar, and a buried plate may be found, for example, in "A 0.6 $\mu$m$^2$256Mb Trench DRAM Cell with Self-Aligned BuriEd STrap (BEST)", by Nesbit et al., 1993 IEEE IEDM, pp. 627–630, Extending Trench DRAM Technology to 0.15 $\mu$m Groundrule and Beyond", by Rupp et al., 1999 IEEE IEDM, pp. 33–36, and "A Fully Planarized 0.25 $\mu$m CMOS Technology for 256 Mbit DRAM and Beyond", by Bronner et al., 1995 Symposium on VLSI Technology Digest of Technical Papers, pp. 15–16. Also, the present invention may employ vertical trench transistors of which description may be found, for example, in "A 0.135 $\mu$m$^2$6F$^2$ Trench-Sidewall Vertical Device Cell for 4Gb/16Gb DRAM" by Radeno et al., 2000 IEEE, pp. 80–81, and "A Novel Trench DRAM Cell with a Vertical Access Transistor and Buried Strap (VERI BEST) for 4Gb/16Gb" by Gruening et al., 1999 IEEE, pp. 25–28. A method of forming the vertical trench transistors is known in this art, thus a detailed description thereof is omitted.

Figure 4:
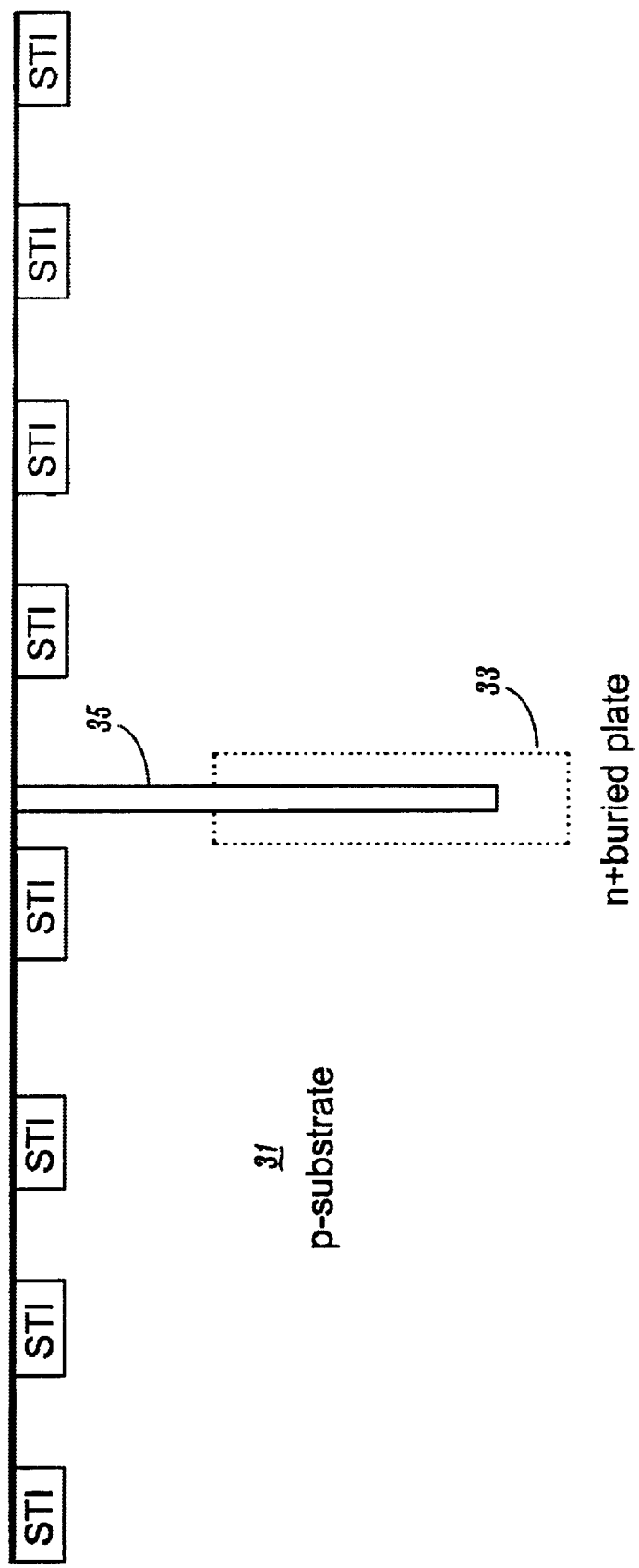
FIG. 4 is a cross-sectional view illustrating formation of shallow trench isolation regions according to the present invention.

Next, electrical isolation structures are formed in the p-substrate 31. As shown in FIG. 4, shallow trench isolation (STI) regions are formed in the upper area of the p-substrate 31 to electrically isolate various portions from each other. Each of the STI regions has a depth of, for example, about 100–500 nm in the p-substrate 31. The STI regions may be formed by using the photolithography, RIE, and oxide deposition and planarization such as chemical mechanical polishing (CMP) techniques, which are well known in this art.

Referring to FIGS. 5 to 8, there are provided cross-sectional views illustrating formation of localized doped regions, such as n-well, p-well, and n-band, in the p-substrate 31. Such doped regions may be formed by using lithography and ion implantation techniques.

Figure 5:
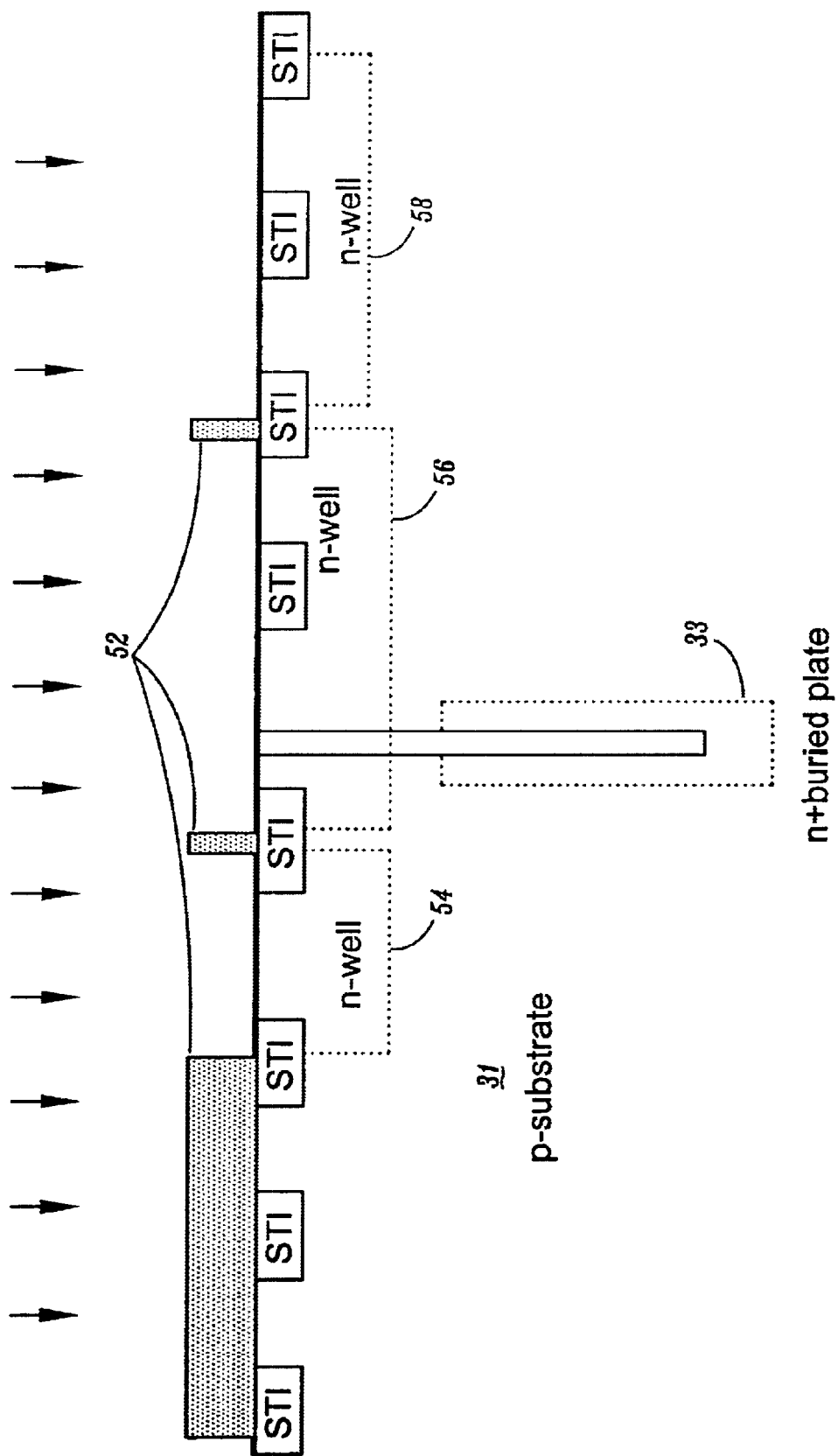
FIG. 5 is a cross-sectional view illustrating formation of n-wells in the substrate according to the present invention.

FIG. 5 shows the formation of n-wells in predetermined regions of the p-substrate 31. A mask layer (or footrests layer) 52 is formed on the surface of the p-substrate 31. The mask layer 52 has a predetermined pattern and is removed by being exposed to a radiation and developed with a developing solution using the techniques known in this art. The mask layer 52 is removed from the regions where the n-wells are to be formed. As a result, the p-substrate 31 is exposed in the regions where the mask layer 52 is removed.

An ion implantation is performed over the surface of the sample, i.e., the p-substrate 31 with the mask layer 52. In this embodiment, n-conductivity type impurity is implanted into the surface of the p-substrate 31. By implanting the n-conductivity type impurity, the n-wells 54–58 are formed in the non-masked regions as shown in FIG. 5. In the subsequent process, oxide p-channel transistors and flash memory and DRAM transistors will be formed in the n-wells 54–58. This is described in detail below.

Figure 6:
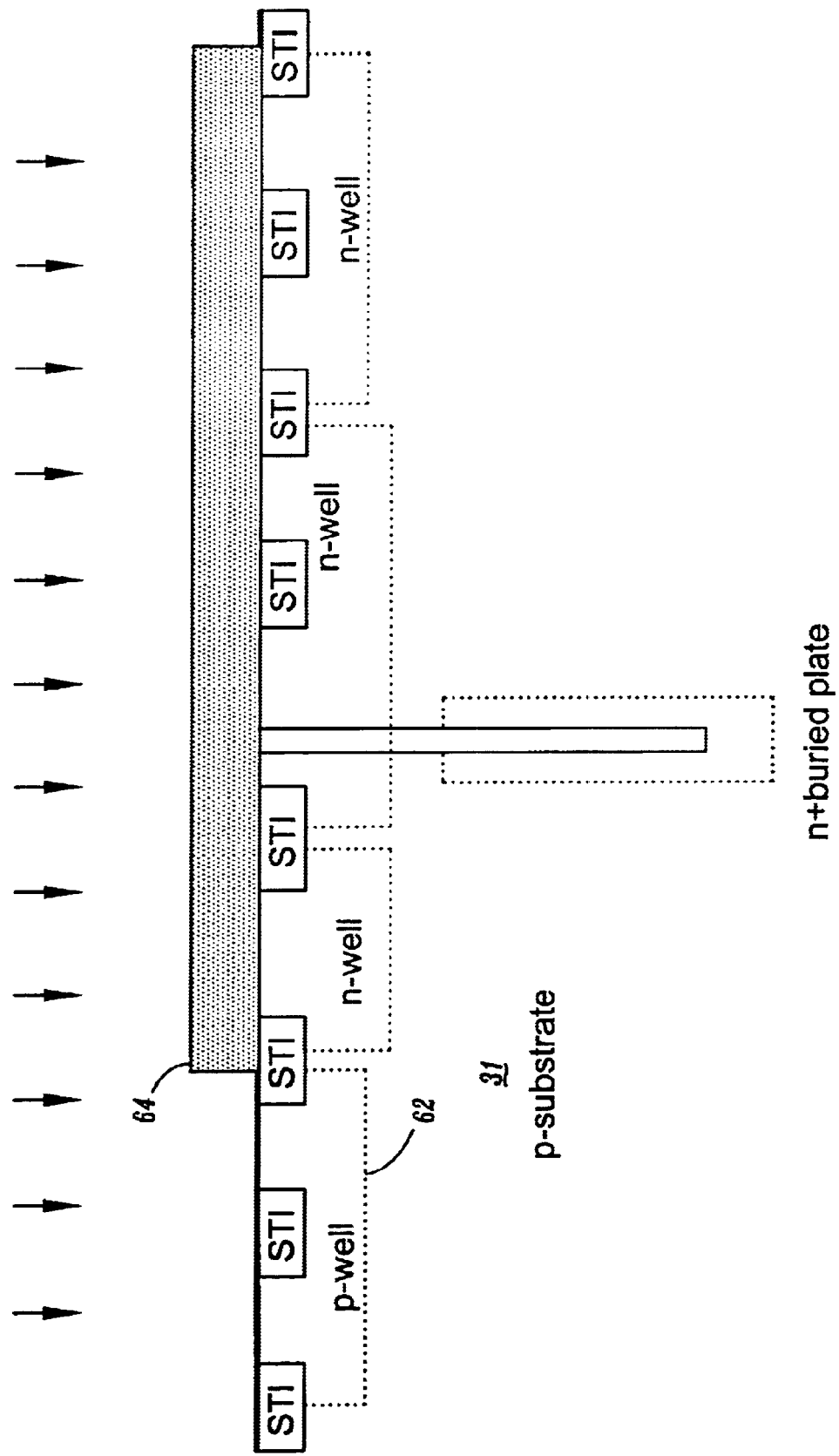
FIG. 6 is a cross-sectional view illustrating formation of a support p-well in the substrate according to the present invention.

In FIG. 6, a cross-sectional view is provided to illustrate the formation of a support p-well 62 in the p-substrate 31. To form the support p-well 62, a mask layer 64 having a different pattern is deposited on the surface of the p-substrate 31. The mask layer 64 is removed from the regions where oxide n-channel transistors are to be formed. By implanting p-conductivity type impurity into the surface of the sample, i.e., the p-substrate 31 with the mask layer 64, the support p-well 62 is formed in the non-masked region as shown in FIG. 6. In the subsequent process, oxide n-channel transistors for support circuits will be formed in the support p-well 62. This is described in detail below.

Figure 7:
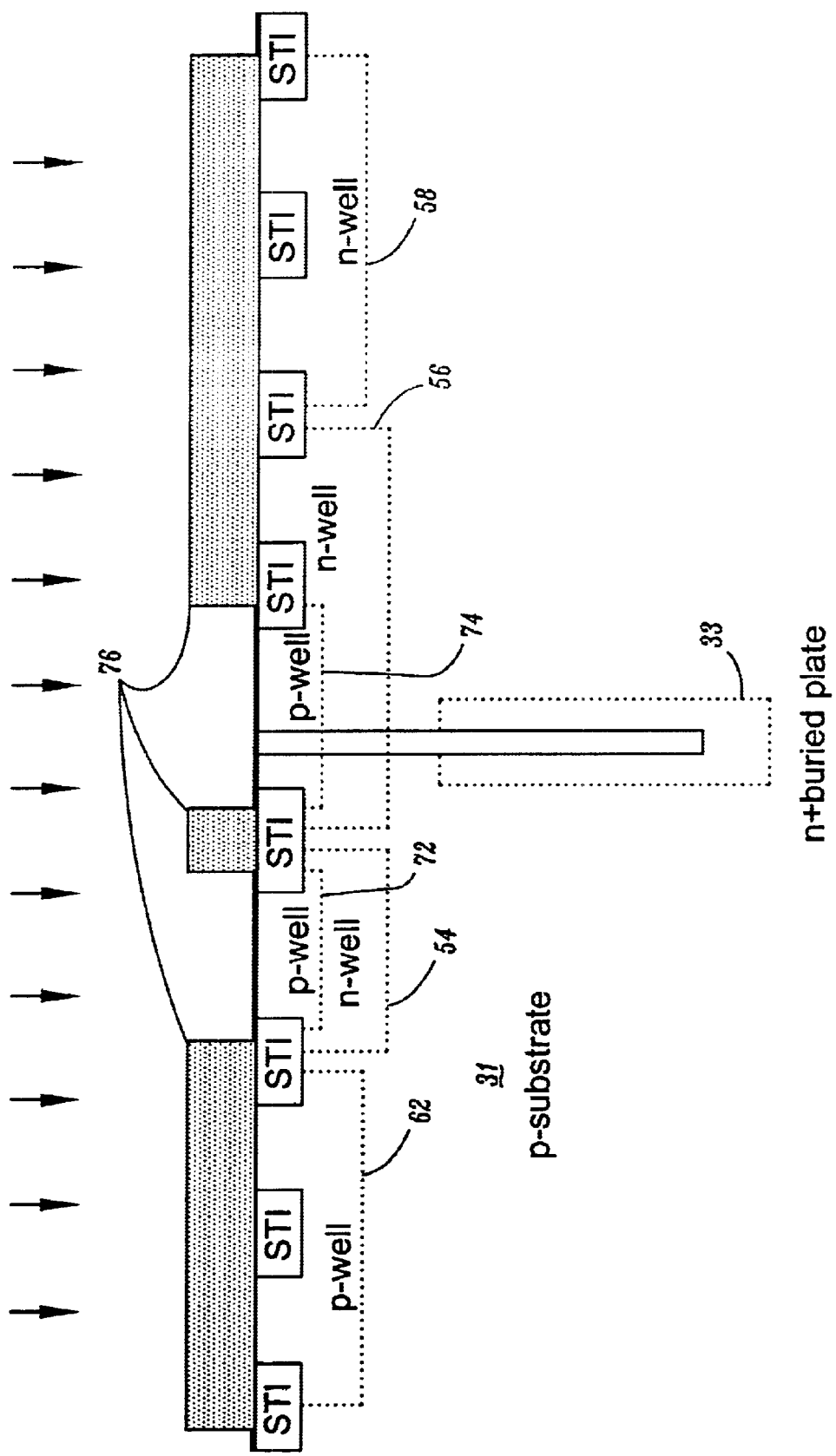
FIG. 7 is a cross-sectional view illustrating formation of array p-wells according the present invention.

FIG. 7 shows the formation of array p-wells 72, 74 in the n-wells 54, 56, respectively. After removing the mask layer 64 (referring to FIG. 6) from the surface of the p-substrate 31, a new mask layer 76 having a predetermined pattern is deposited on the surface of the p-substrate 31. The mask layer 76 is removed from the regions according to the pattern. In this embodiment, the mask layer 76 is removed from the regions of the n-wells 54, 56. On the regions where the mask layer 76 is removed, the array p-wells 72, 74 are formed by implanting p-conductivity type impurity into the surface of the p-substrate 31. As a result, the array p-wells 72, 74 are formed in the n-wells 54, 56, respectively. In the regions of the array p-wells 72, 74, DRAM and flash memory devices will be formed.

Figure 8:
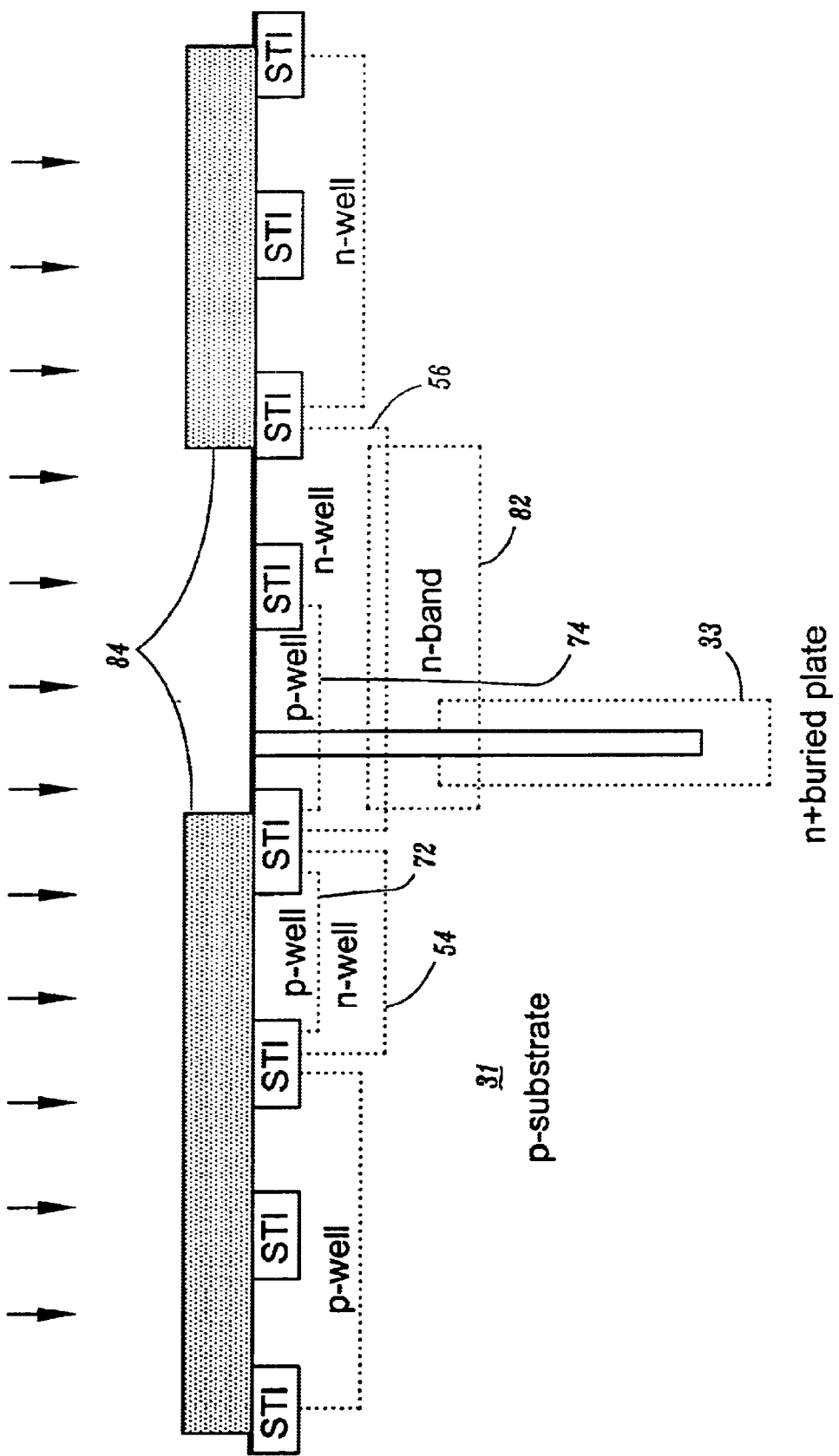
FIG. 8 is a cross-sectional view illustrating formation of an n-band in the substrate according to the present invention.

In FIG. 8, a cross-sectional view is provided to illustrate the formation of an n-band 82 in the p-substrate 31. After removing the mask layer 76 (referring to FIG. 7) from the surface of the p-substrate 31, a new mask layer 84 having a predetermined pattern to form the n-band 82 is deposited on the p-substrate 31. The mask layer 84 is then removed from the regions of the n-well 56 and array p-well 74. An ion implantation is performed over the surface of the sample, so that n-conductivity type impurity is implanted into the surface of the p-substrate 41 in the regions where the mask layer 84 is removed. As a result, the n-band 82 is formed in the p-substrate 31 to connect the n$^+$-buried plate 33 to the n-well 56 to provide capability to electrically bias the n$^+$-buried plate 33. The n-band 82 will form an electrical connection between the n$^+$-buried plate 33 and a region of the n-well 56 and thus enable the application of an electrical bias to the n$^+$-buried plate 33.

Figure 9:
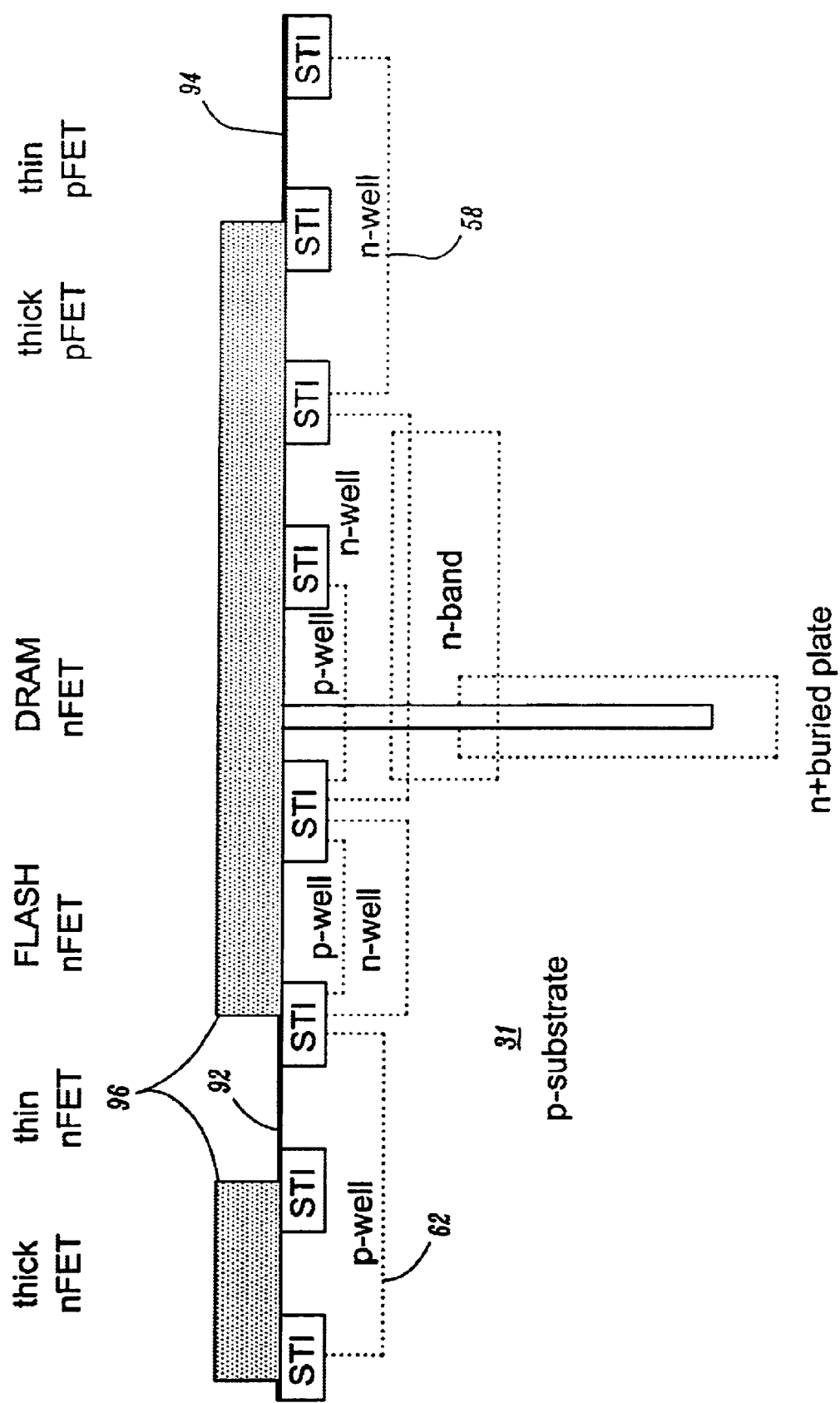
FIG. 9 is a cross-sectional view illustrating formation of thin gate oxides according to the present invention.
Figure 10:
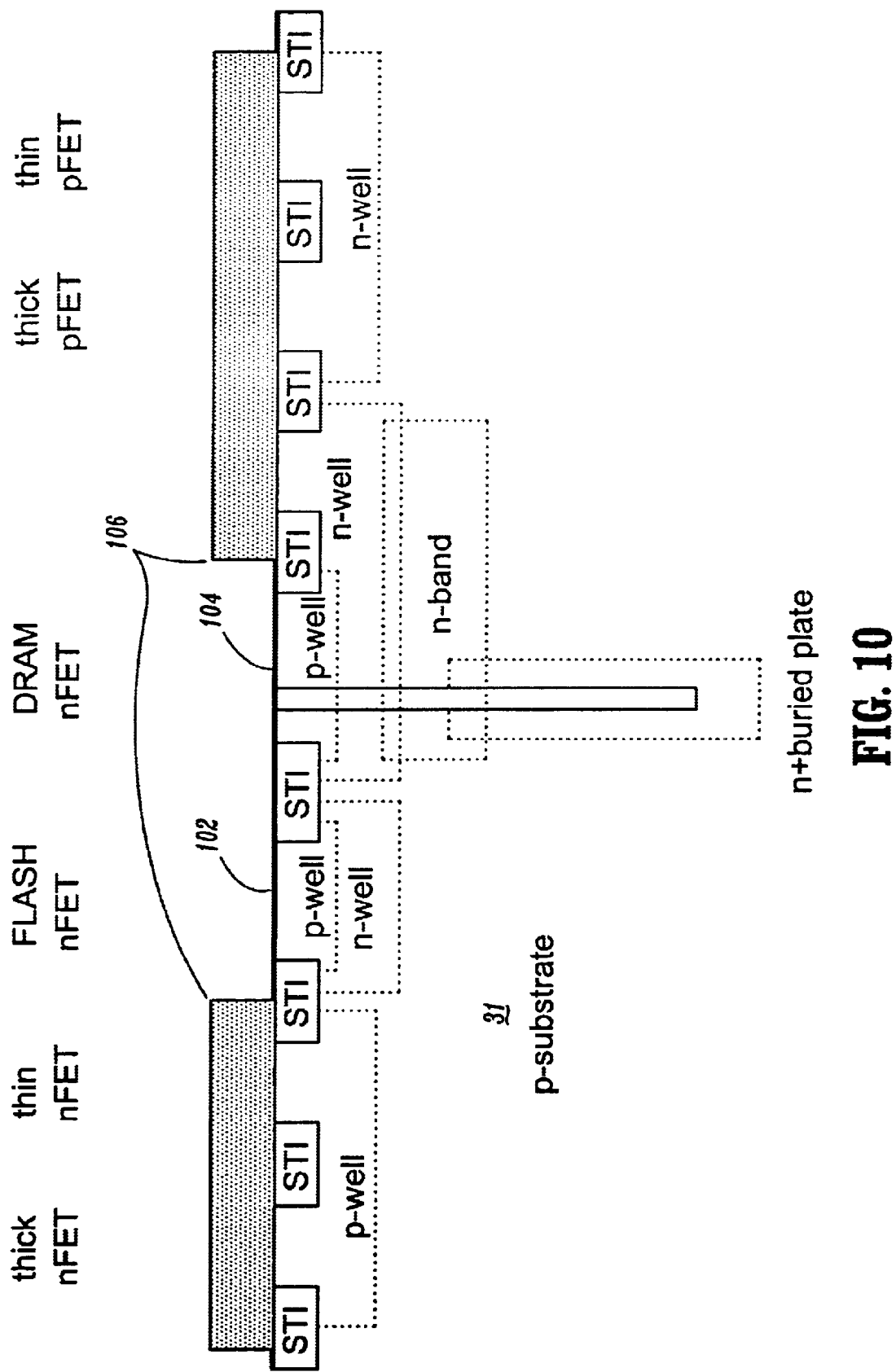
FIG. 10 is a cross-sectional view illustrating formation of array gate oxides according to the present invention.
Figure 11:
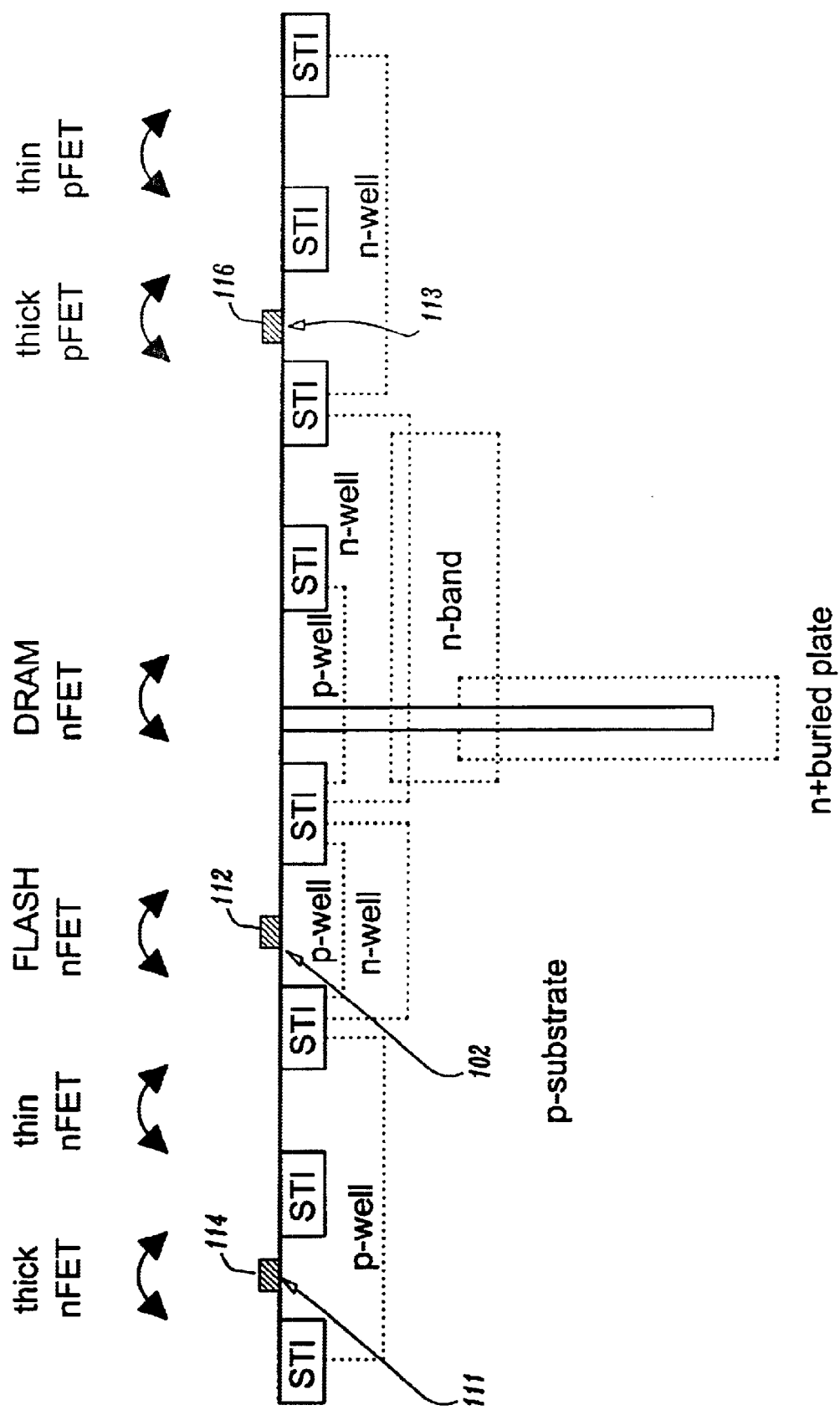
FIG. 11 is a cross-sectional view illustrating formation of gate electrodes for flash memory and thick oxide transistors according to the present invention.

In FIGS. 9–11, there are provided cross-sectional views illustrating formation of thin and thick gate oxides on the surface of the p-substrate 31. The thin and thick gate oxides are formed for thin and thick oxide p- or n-channel transistors, and flash and DRAM gate oxides are also formed for flash and DRAM transistors. The thin and thick gate oxides and the flash and DRAM gate oxides are formed, for example, using thermal oxidation of the gate oxides which includes deposition of dielectric materials by means of LPCVD or physical vapor deposition (PVD), lithography, and RIE.

FIG. 9 shows formation of the thin gate oxides 92, 94 for thin n-channel and p-channel transistors, respectively. To form the thin gate oxides 92, 94, a new mask layer 96 is formed on the surface of the p-substrate 31 and then removed from the regions where the thin n- and p-channel transistors will be formed. In the regions where the mask layer 96 is removed, an ion implantation of nitrogen is performed which will retard the thermal oxidation in the regions where the mask layer 96 is removed and hence provide in these regions the gate oxides 92, 94 which are thin compared with those in other regions. The gate oxide layer, preferably a silicon dioxide layer, is substantially grown or deposited to form the thin gate oxides 92, 94. The thin gate oxides 92, 94 have thickness, for example, in the range from about 2 nm to about 5 nm. In this embodiment, the mask layer 96 is patterned to be removed from the surfaces of the support p-well 62 and the n-well 58 on which the thin gate oxides 92, 94 are formed, respectively.

After the nitrogen implantation in the thin gate oxide regions, the mask 96 is removed to form thick gate oxides on the substrate 31. The thick gate oxide are formed for thick transistors for support circuits. The thick gate oxides are formed in the regions not implanted by the nitrogen implantation, which the thin gate oxides are formed in regions implanted by means of the patterned mask layer 96. The thick gate oxides preferably have thickness in the range from about 3 nm to about 20 nm, and more preferably have thickness of about 7 nm.

FIG. 10 shows formation of the flash and DRAM array gate oxides 102, 104 for flash memory and DRAM transistors, respectively. After removing the mask layer 96 (referring to FIG. 9), a new mask layer 106 is formed on the surface of the substrate 31. The mask layer 106 having a predetermined pattern is removed from the regions where the flash memory and DRAM transistors will be formed. In the regions where the mask layer 106 is removed, the array gate oxides 102, 104 (e.g., silicon dioxide layers) are formed. It should be noted that since flash memory and DRAM transistors may be conveniently located anywhere on the substrate 31, the array gate oxides 102, 104 are not necessarily adjacent. The array gate oxides 102, 104 preferably have thickness in the range from about 3 nm to about 10 nm, and more preferably have thickness of about 6 nm.

In FIG. 11, it is shown that gate conductor electrodes 112, 114, 116 are formed on the gate oxides 102, 111, 113, respectively, which were not subject to the nitrogen implantation. Preferably, the gate conductor electrodes 112, 114, 116 are for a flash memory transistor, a thick oxide n-channel transistor, and a thick oxide p-channel transistor, respectively. The gate conductor electrodes 112, 114, 116 may be formed by deposition of polysilicon and lithography and dry etch as is known in the art.

Figure 12:
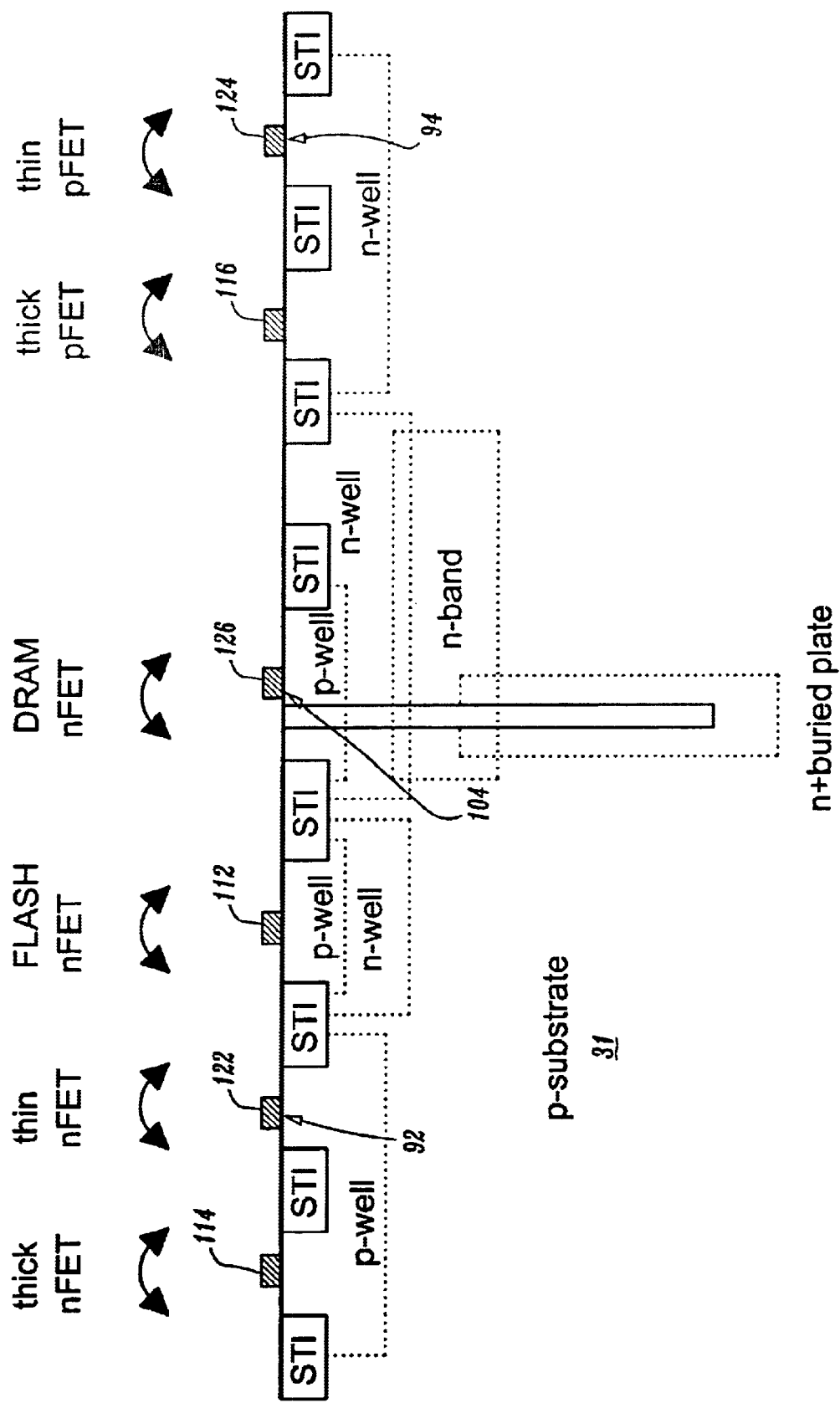
FIG. 12 is a cross-sectional view illustrating formation of oxide gates for DRAM and thin oxide transistors according to the present invention.

FIG. 12 shows formation of gate conductor electrodes 122, 124, 126 on the gate oxides 92, 94, 104, respectively. The gate electrodes 122, 124, 126 are preferably formed for a thin oxide n-channel transistor, a thin oxide p-channel transistor, and a DRAM n-channel transistor.

In this embodiment, by forming the gate conductor electrodes 112, 114, 116, 122, 124, 126 on the regions of the p- and n-wells of the substrate 31, the thick and thin oxide transistors and the flash memory and DRAM transistors are formed as shown in FIG. 12. It should be noted that the transistors may be formed in the regions as desired. The thick oxide transistors are suitable for, for example, high voltage input/output and flash memory programming. The thin oxide transistors are suitable for high-performance operation.

The thin and thick gate oxides may have different thickness depending on different devices (i.e., transistors) using lithographic masking and shallow ion implantation of nitrogen in selected regions of the substrate, and/or selective remove and regrowth of the gate oxides in selected regions of the substrate, as described above with reference to FIG. 9.

In forming the flash memory transistor, a flash floating gate (not shown) is formed using processing techniques known to the art such as CVD, thermal oxidation, and additional lithographic masking levels as required.

Figure 13:
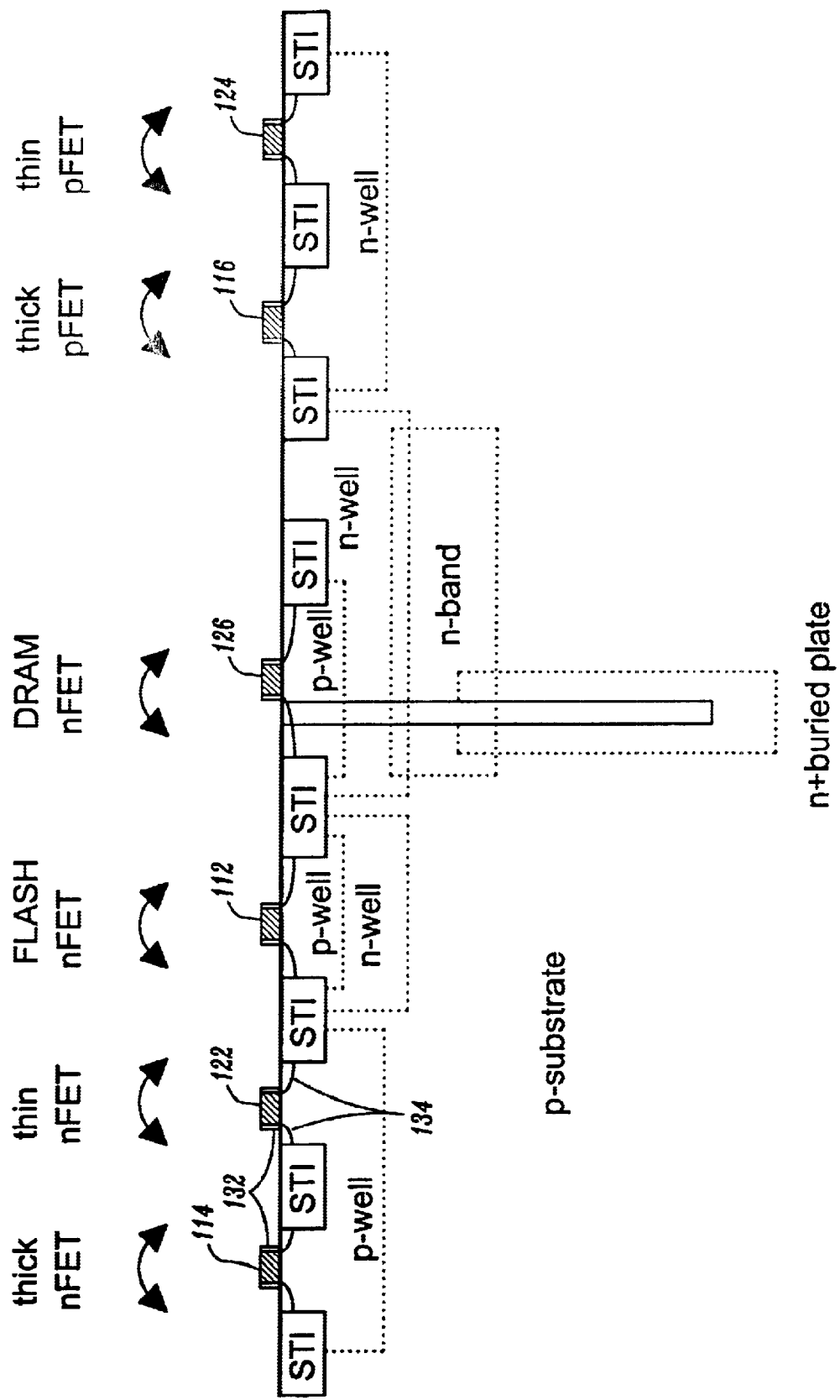
FIG. 13 is a cross-sectional view illustrating formation of sidewall spacers according to the present invention.
Figure 14:
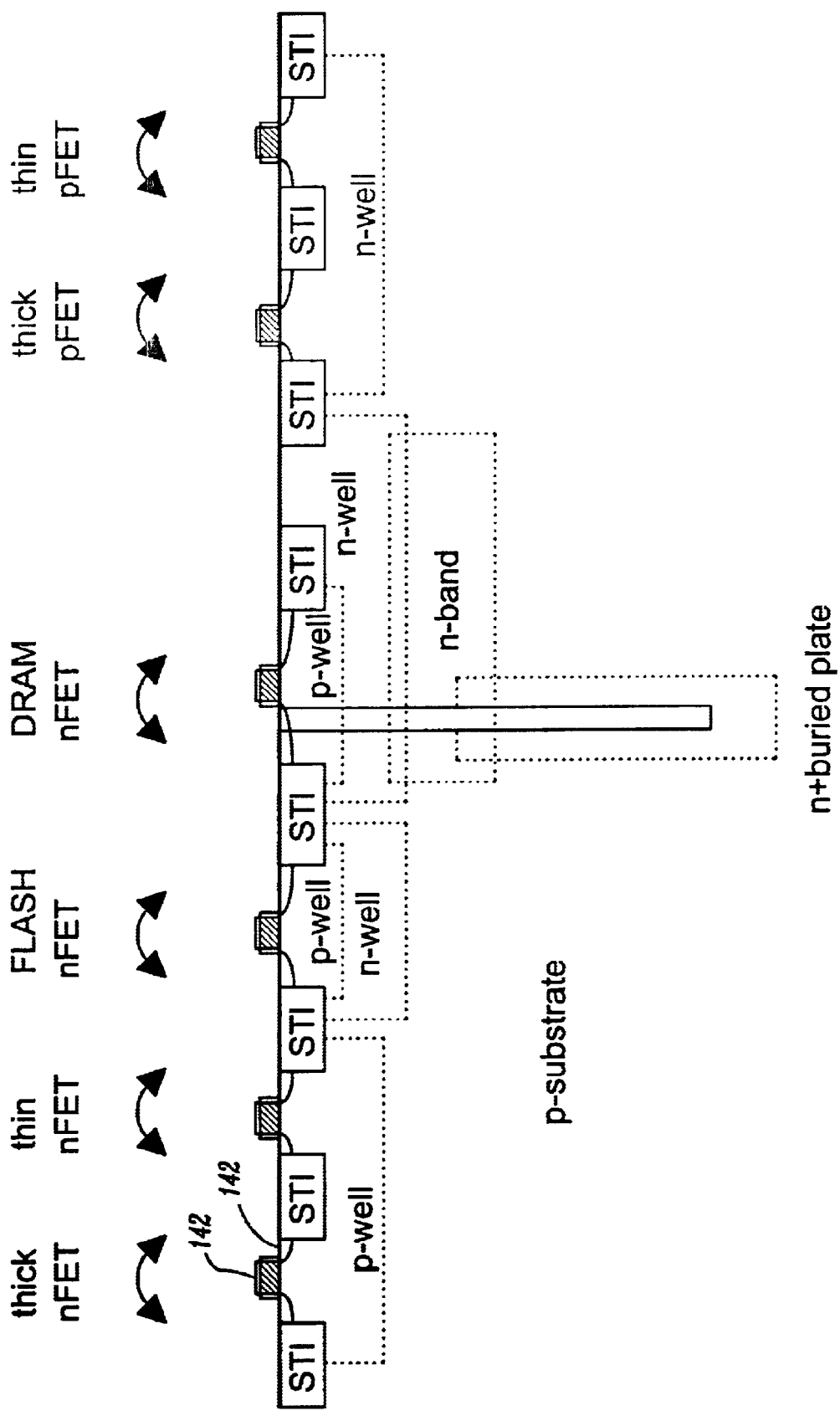
FIG. 14 is a cross-sectional view illustrating formation of salicide source/drain regions according to the present invention.

FIGS. 13 and 14 show formation of sidewall spacers 132 and source/drain regions 134 of the transistors, 112, 114, 116, 122, 124, 126. The spacer may have thickness in the range from about 5 nm to about 50 nm.

The source/drain regions 134 for each of the transistors 112, 114, 116, 122, 124, 126 are formed by performing source/drain ion implantation and lithography as known in the art. The source/drain regions 134 are implanted before or after formation of the sidewall spacers 132 to provide lightly-doped regions directly adjacent to the transistor channel as is known in the art. As shown in FIG. 14, the source/drain regions 142 are preferably salicide (or self-aligned silicide) to form sources and drains self-aligned to the respective transistors. Preferably, the salicide source/drain regions 142 may be formed by thermal reaction of cobalt with the substrate as known in the art.

Figure 15:
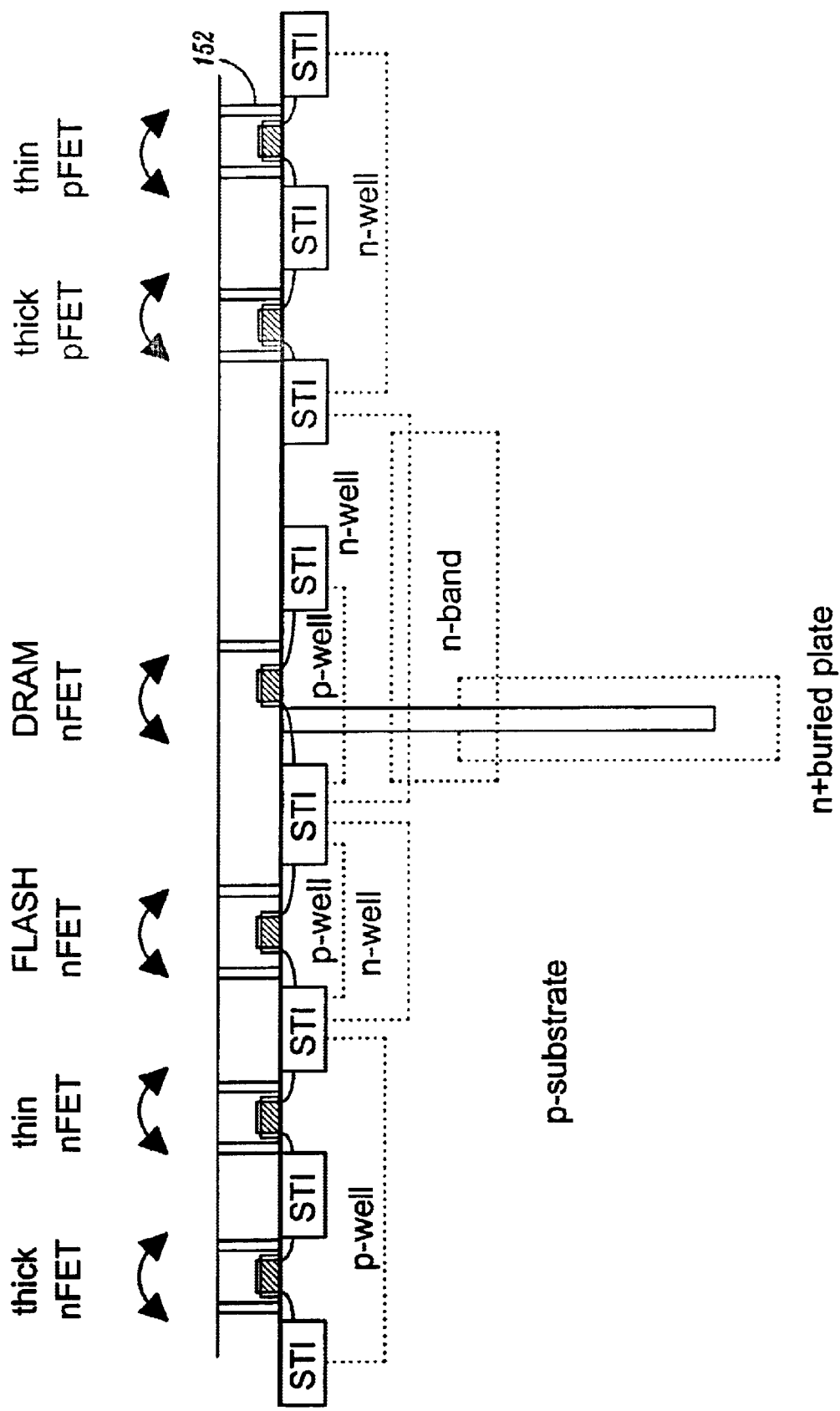
FIG. 15 is a cross-sectional view illustrating formation of contact studs according to the present invention.
Figure 16:
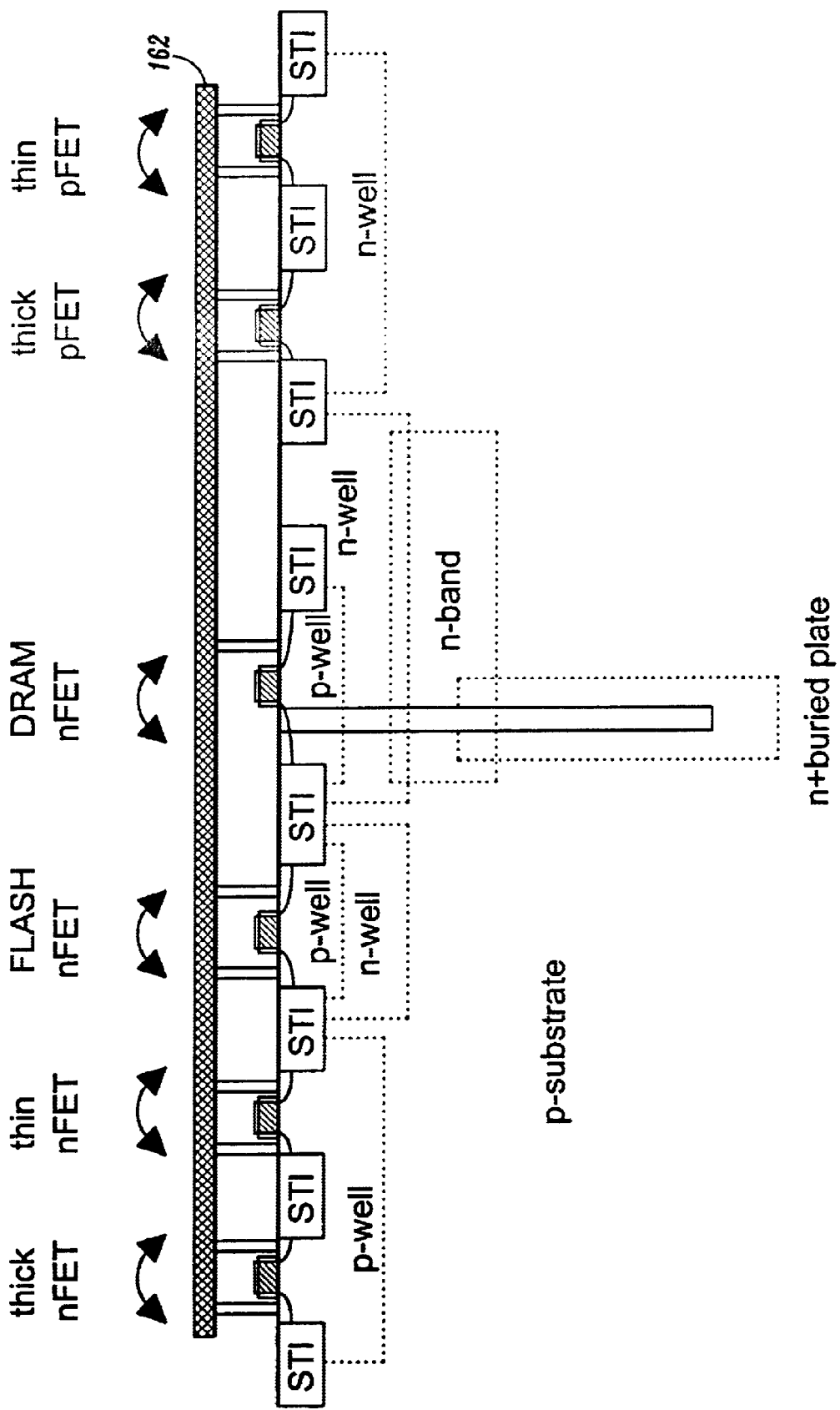
FIG. 16 is a cross-sectional view illustrating formation of interconnection layer according to the present invention.

FIGS. 15 and 16 show formation of contact studs 152 and interconnection layer 162. In FIG. 15, the contact studs 152 may be formed, for example, using physical vapor deposition (PVD) of thin barrier layers such as titanium (Ti) and chemical vapor deposition (CVD) and chemical-mechanical polishing (CMP) of tungsten (W), which are known to this art. In FIG. 16, the interconnection layer 162 may be either AlCu wires made by using RIE technique or damascene structure filled with a metal such as aluminum (Al) or copper (Cu).

Figure 17:
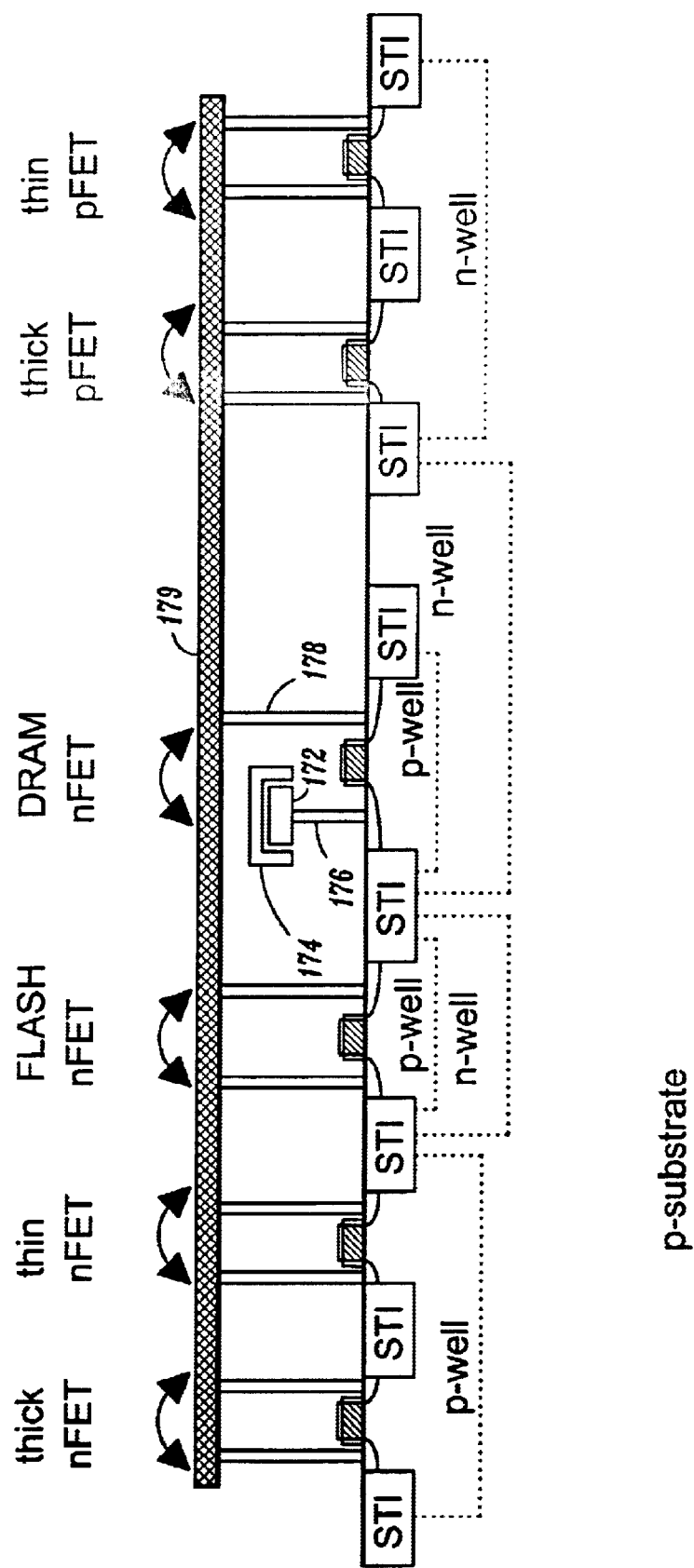
FIG. 17 is a cross-sectional view illustrating formation of a stacked capacitor according to the present invention.

FIG. 17 is a cross-sectional view of a semiconductor device having merged DRAM and flash memory devices according to another preferred embodiment of the present invention. In this embodiment, the semiconductor of the present invention employs a stacked capacitor 172 instead of the trench capacitor 35 which is used in the above described embodiment. In other words, the stacked capacitor 172 serves as a charge storage element for the DRAM transistor. Thus, the semiconductor device in FIG. 17 does not have the $n^+$-buried plate 33, trench capacitor 35, and n-band 82 (referring to FIG. 8). On the stacked capacitor 172, a plate electrode 174 is formed so that the stacked capacitor 172 and the plate electrode 174 serve as the trench capacitor 35 and $n^+$-buried plate 33, respectively.

The semiconductor device in FIG. 17 also has a contact stud 176 to connect the stacked capacitor 172 to the DRAM transistor. One end of the contact stud 176 is connected to the stacked capacitor 172 and the other end is connected to the source/drain region of the DRAM transistor (e.g., DRAM n-FET). The structure of contact studs 178 and interconnection layer 179 is optimized for the structure having the stacked capacitor 172.

What is claimed is:

1. A method for fabricating dynamic random access memory (DRAM) and flash memory cells on a single chip, comprising the steps of:

providing a silicon substrate;

forming a trench capacitor for each of the DRAM cells in the silicon substrate;

forming isolation regions in the silicon substrate, the isolation regions being electrically isolated from each other;

forming first type wells for DRAM and flash memory cells at first predetermined regions of the silicon substrate by implanting a first type impurity in the first predetermined regions;

forming second type wells for DRAM and flash memory cells at second predetermined regions in the first type wells by implanting a second type impurity in the second predetermined regions, wherein the first and second type wells for the DRAM cells are connected to a corresponding trench capacitor for the DRAM cell;

forming a buried capacitor plate in the silicon substrate, the buried capacitor plate being connected to the trench capacitor;

forming a first type band in the silicon substrate, the first type band being connected between the buried capacitor plate and the first type well for the DRAM cell;

forming oxide layers for DRAM and flash memory cells on the second type wells;

forming gate electrodes for DRAM and flash memory cells on the oxide layers for DRAM and flash memory cells; and forming source and drain regions for DRAM and flash memory cells in the respective second type wells for DRAM and flash memory cells, the source and drain regions being associated with each of the gate electrodes for DRAM and flash memory cells.

2. The method of claim 1, wherein the isolation regions are shallow trench isolation regions having depth in a range from about 100 nm to about 500 nm.

3. The method of claim 1, wherein the trench capacitor has depth in a range from 6 µm to about 10 µm.

4. The method of claim 1, wherein forming the first type wells for DRAM and flash memory cells includes the steps of:

forming a mask layer having a first pattern on the silicon substrate;

partially removing the mask layer in accordance with the first pattern; and performing ion implantation with the first type impurity in the first predetermined regions where the mask layer is removed.

5. The method of claim 4, wherein the first type wells are n-wells and the first type impurity is n-conductivity type impurity.

6. The method of claim 4, wherein the trench capacitor is connected to a corresponding first type well for a DRAM cell.

7. The method of claim 4, wherein forming the second type wells for DRAM and flash memory cells includes the steps of:

removing the mask layer having the first pattern from the silicon substrate;

forming a mask layer having a second pattern on the silicon substrate;

partially removing the mask layer in accordance with the second pattern; and performing ion implantation with the second type impurity in the second predetermined regions where the mask layer is removed.

8. The method of claim 7, wherein the second type wells are p-wells and the second type impurity is p-conductivity type impurity.

9. A method for fabricating dynamic random access memory (DRAM) and flash memory cells on a single chip, comprising the steps of:

providing a silicon substrate:

forming a trench capacitor for each of the DRAM cells in the silicon substrate:

forming isolation regions in the silicon substrate, the isolation regions being electrically isolated from each other:

forming first type wells for DRAM and flash memory cells at first predetermined regions of the silicon substrate by implanting a first type impurity in the first predetermined regions;

forming second type wells for DRAM and flash memory cells at second predetermined regions in the first type wells by implanting a second type impurity in the second predetermined regions;

forming a first type band in the silicon substrate, the first type band being connected between a buried capacitor plate connected to the trench capacitor and the first type well for the DRAM cell, wherein forming the first type band includes the steps of:

forming a mask layer having a third pattern on the silicon substrate;

partially removing the mask layer in accordance with the third pattern; and performing ion implantation with the first type impurity in regions where the mask layer is removed;

forming oxide layers for DRAM and flash memory cells on the second type wells;

forming gate electrodes for DRAM and flash memory cells on the oxide layers for DRAM and flash memory cells; and forming source and drain regions for DRAM and flash memory cells in the respective second type wells for DRAM and flash memory cells, the source and drain regions being associated with each of the gate electrodes for DRAM and flash memory cells.

10. The method of claim 9, wherein the first type well and the first type band have n-conductivity impurity and the second type well has p-conductivity impurity.

11. The method of claim 1, wherein forming the oxide layers for DRAM and flash memory cells includes performing ion implantation of nitrogen to retard oxidation in regions where the oxide layers are formed so that the oxide layers have a predetermined thickness.

12. The method of claim 11, wherein the oxide layers for DRAM and flash memory cells have thickness in a range from about 3 nm to about 10 nm.

13. The method of claim 1, further including the steps of:

forming first type wells for support devices in the silicon substrate by implanting the first type impurity;

forming second type wells for support devices in the silicon substrate by implanting the second type impurity; and forming oxide layers for support devices on the first and second type wells for support devices.

14. The method of claim 13, further including performing ion implantation of nitrogen to retard oxidation in regions where the oxide layers for support devices are formed so that the oxide layers for support devices have a predetermined thickness.

15. The method of claim 14, wherein the oxide layers for support devices includes thin oxide layers having thickness in a range from about 2 nm to about 5 nm and thick oxide layers having thickness in a range from about 3 nm to about 20 nm.

16. The method of claim 13 further including the steps of:
forming gate electrodes for support devices on the oxide layers for support devices; and
forming source and drain regions for support devices in the first and second type wells for support devices, the source and drain regions for support devices being associated with each of the gate electrodes for support devices.

17. The method of claim 16, further including forming sidewall spacers on sidewalls of each of the gate electrodes for DRAM and flash memory cells and support devices.

18. The method of claim 16, wherein the source and drain regions associated with each of the gate electrodes for DRAM and flash memory cells and support devices are self-aligned silicide.

19. The method of claim 16, wherein the first type wells for DRAM and flash memory cells and the first type wells for support devices are formed at a substantially same time; the second type well for DRAM and flash memory cells and the second type well for support devices are formed at a substantially same time; the gate electrodes for DRAM and flash memory cells and the gate electrodes for support devices are formed at a substantially same time; and the oxide layers for DRAM and flash memory cells and the oxide layers for support devices are formed at a substantially same time.

* * * * *